United States Patent [19]

Lin

[11] Patent Number: 4,993,033
[45] Date of Patent: Feb. 12, 1991

[54] HIGH POWER FAST SWITCH

[75] Inventor: Shiow-Hwa Lin, San Diego, Calif.

[73] Assignee: Thermo Electron Technologies Corp., San Diego, Calif.

[21] Appl. No.: 452,002

[22] Filed: Dec. 18, 1989

[51] Int. Cl.$^5$ ............................................. H01S 3/097
[52] U.S. Cl. ........................................ 372/30; 372/87
[58] Field of Search ...................... 372/10, 12, 13, 25, 372/29, 30

[56] References Cited

PUBLICATIONS

Lee et al.; "A Diamond Opto-Electronic Switch"; Opt. Comm., vol. 46, No. 3, 4; Jul. 1, 1983.
Acig & Bloom, Electron-Hole-Pair Creation Energies in Semiconductors, Phy. Rev. Let.
Ho et al., A Diamond Opto-Electronics Switch, Optics Communications, Jul. 1983.

Primary Examiner—Léon Scott, Jr.
Attorney, Agent, or Firm—John R. Ross

[57] ABSTRACT

A high power fast switch for generating pulses of current to a load from a high voltage power source. A laser beam illuminates a cathode which simulates the emission of pulses of electrons which illuminate a diamond target. The pulses of electrons cause the diamond target to become conductive permitting high power pulses of electric current to pass through the diamond target from a high voltage source to a load. In a preferred embodiment a Klystron buncher compresses the electron pulses onto the diamond target.

7 Claims, 6 Drawing Sheets

HIGH POWER FAST SWITCH

This invention relates to electrical switches and in particular to fast solid state switches.

BACKGROUND OF THE INVENTION

It is known that a diamond can be made to conduct electricity by illuminating it with ultra violet light, fast electrons or other atomic particles. A switch based on the principle of illumination with ultra violet light has been proposed by Ho et al. in Optics Communication 46, 202 (1983). This switch apparently works reasonably well for power levels up to about 10 kW. It has been known for many years that current flow between a photoemission cathode and an anode can be controlled by illuminating the cathode with an appropriate laser beam.

What is needed is a switch capable of generating nanosecond pulses in the range of 100 kW and more with sharp rise times.

SUMMARY OF INVENTION

The present invention provides a high power fast switch for generating pulse of current to a load from a high voltage power source. A laser beam illuminates a cathode which stimulates the emission of pulses of electrons which illuminate a diamond target. The pulses of electrons cause the diamond target to become conductive permitting high power pulses of electric current to pass through the diamond target from a high voltage source to a load. In a preferred embodiment a Klystron buncher is used to compresses an electron pulse with longer pulse width into a very short electron bunch which then illuminates the diamond target.

DETAILED DESCRIPTION OF PREFERRED EMBODIMENTS

The present invention can be described by reference to the figures.

Figure 1:
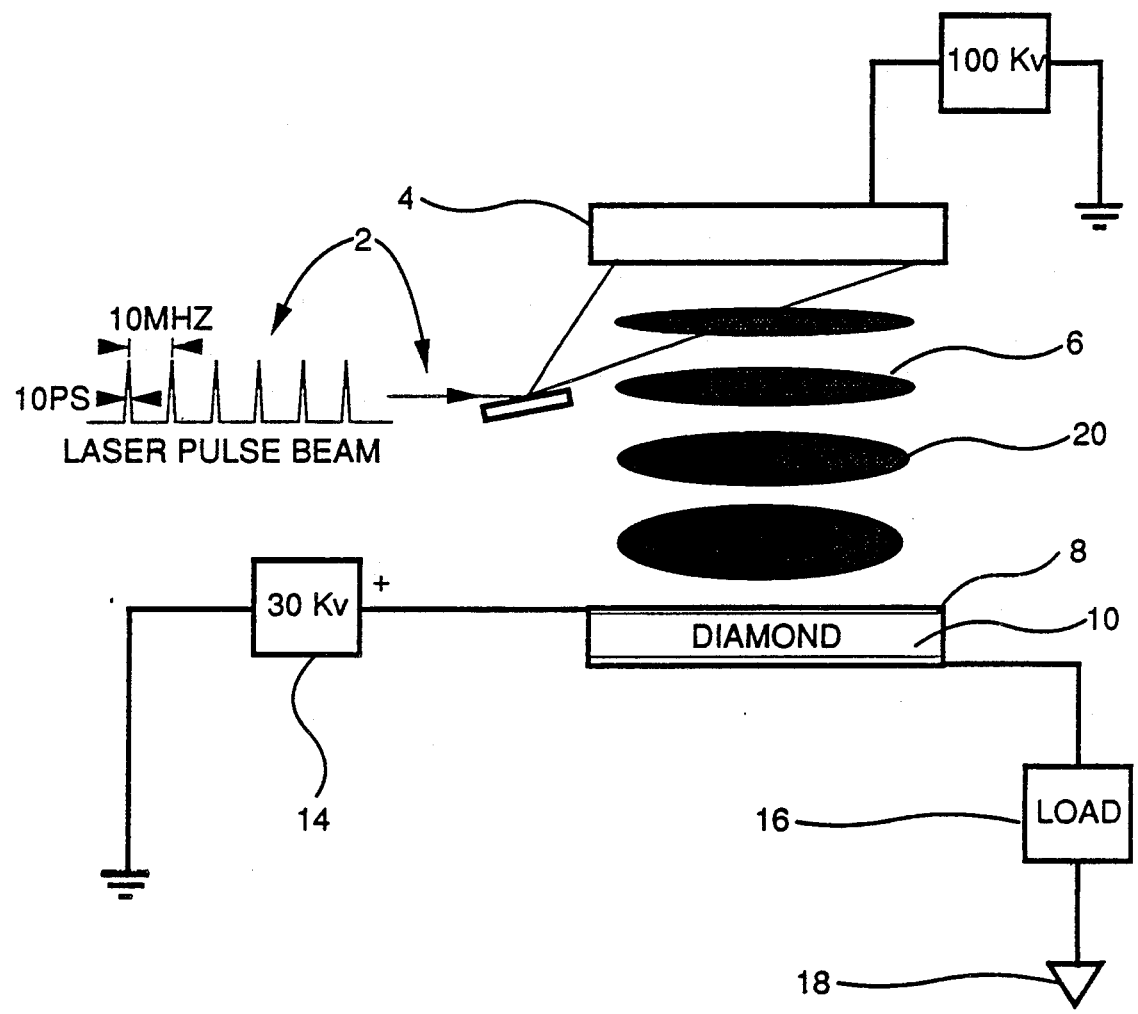
FIG. 1 is a partial block, partial schematic drawing of a preferred embodiment of the present invention.
Figure 2:
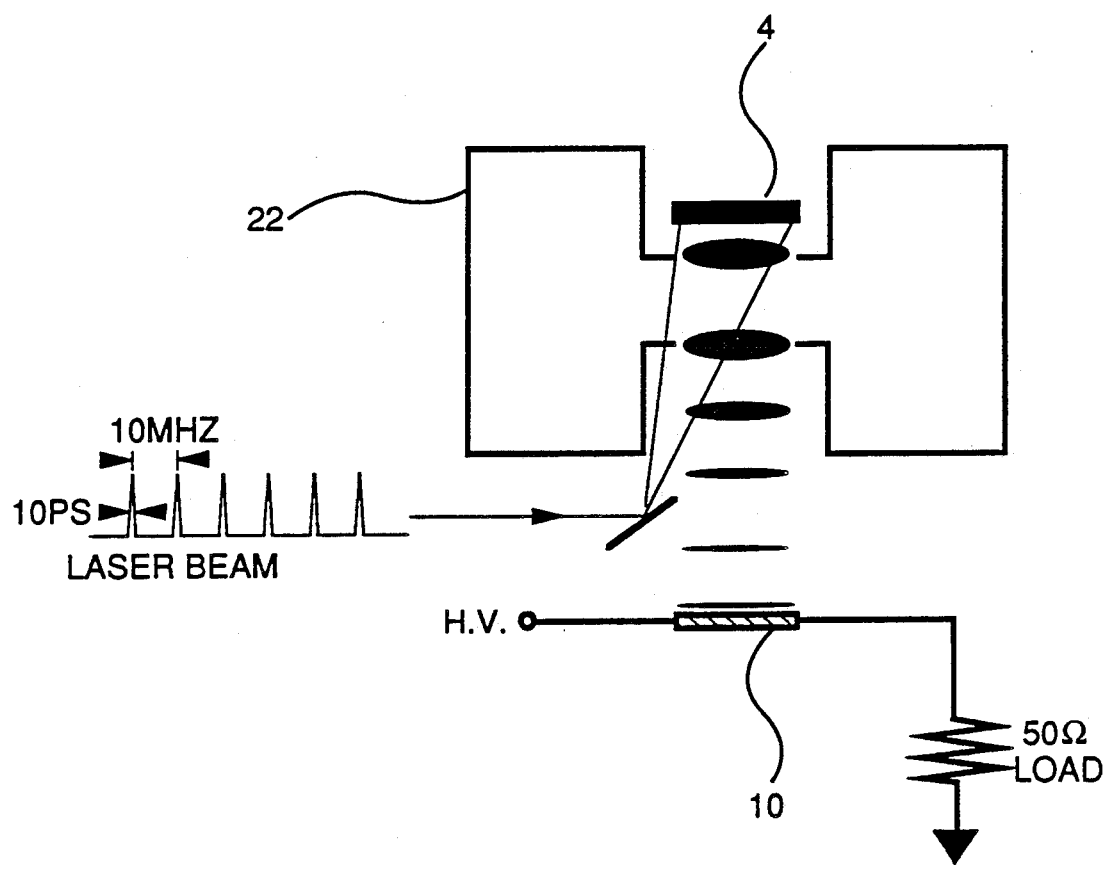
FIG. 2 is a partial block, partial schematic drawing of a slightly more elaborate embodiment of the present invention.
Figure 3:
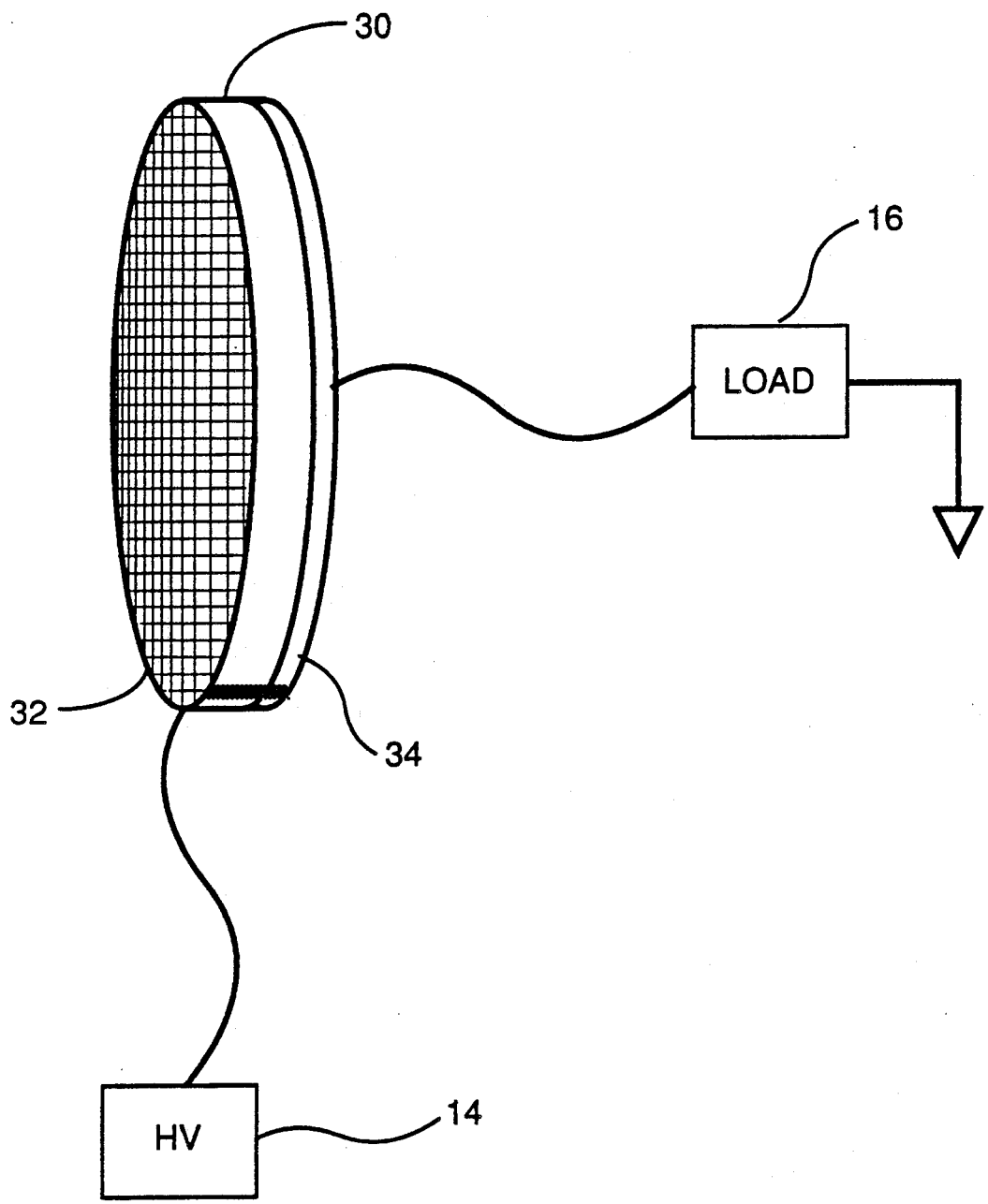
FIG. 3 is a schematic drawing of showing some particular features of the diamond target used in the embodiment depicted in FIGS. 1 and 2.

FIG. 1 is a drawing showing the basic principles of the invention. A frequency doubled Nd:YAG pulsed beam 2 from a frequency doubled Nd:YAG laser illuminates a photocathode 4 producing pulses of electrons 6 which are accelerated by a high voltage grid 8 toward a diamond target 10. The electron pulse causes the diamond target 10 to become highly conductive only while the pulse is passing through the target, thus, current is permitted to flow from high voltage source 14 through load 16 to ground 18. Thus, current flows through load 16 only while electron clouds are passing through diamond target 10. As indicated at 20 the electron pulses tend to spread out as they advance toward grid 8 because of the mutually repulsive forces of the electrons. To provide for sharper pulses of current through load 16 a Klystron buncher 22 can be added as shown in FIG. 2. The buncher, currently available from suppliers such as Varian slows down the electron in the leading edge of the electron cloud and speeds up the electrons in the trailing edge of the cloud. The net effect is that the electron cloud is "focused" on the diamond target 10. A suitable photocathode 4 is a S-20 photocathode available from ITT. Diamond chips suitable for this switch embodiment are available from Drukker International, distributed in the United State by Dubbeldee Harris Diamond Corporation. A preferred diamond switch design is shown in FIG. 3. Chips suitable for use in our switch are small (i.e., less than 0.1 carat) and are relatively inexpensive.

The body 30 of diamond target 10 is in the form of a diamond chip (about 0.5 cm diameter and 0.3 mm thick) a metal grid 32 is deposited on the front surface, which surface is illuminated by the electron pulses. The high voltage source 14 is connected at a ring around the front edge of the chip as shown in FIG. 3. On the back surface, a thin moralized layer 34 is deposited by a process such as sputtering or vapor deposition and a conductor is attached to layer 34 to carry current to the load 16.

Figure 4:
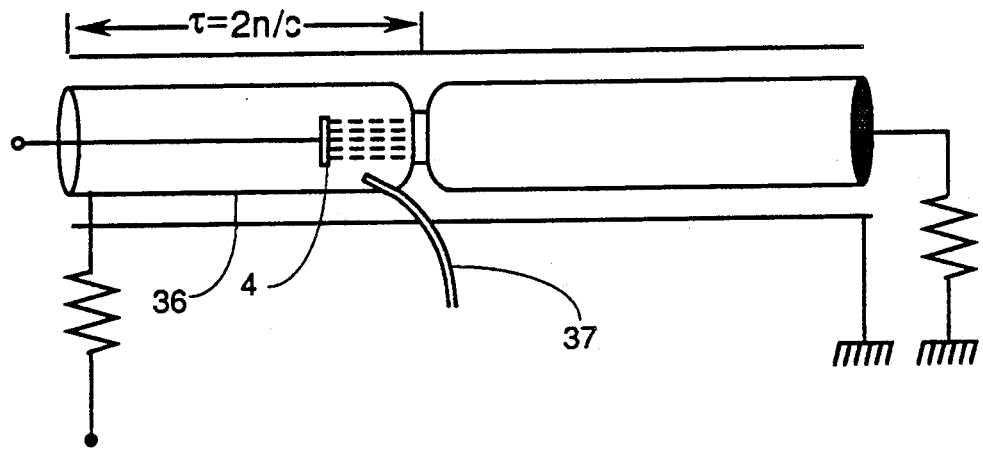
FIG. 4 is a schematic diagram of a third embodiment of the present invention.
Figure 5:
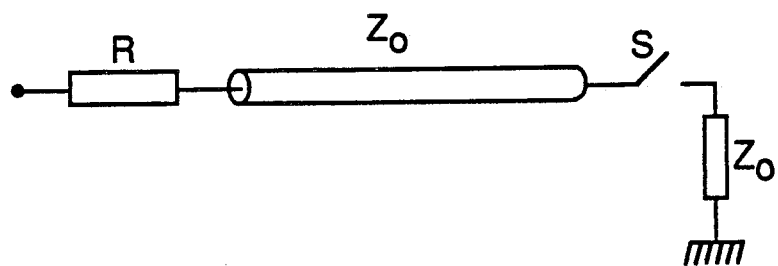
FIG. 5 is the electrical equivalent of FIG. 4.
Figure 5A:
FIG. 5A is a sketch of the pulse produced by the embodiment depicted in FIGS. 4 and 5.

Two examples of pulse forming networks are shown in FIGS. 4 and 5 and FIGS. 6 and 7. FIG. 4 is a schematic diagram of an embodiment designed to provide a simple square pulse generator. Here the cathode is mounted inside coaxial cable 35. The laser pulses are supplied through optical fiber 37 to cathode 4. The net electrical circuit corresponding to this embodiment is shown in FIG. 5 and the power pulse is shown in FIG. 5A.

Figure 6:
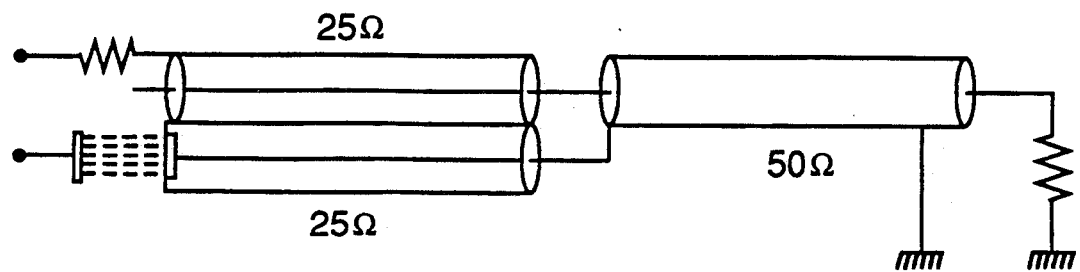
FIG. 6 is a schematic drawing of a forth embodiment of the present invention.
Figure 7:
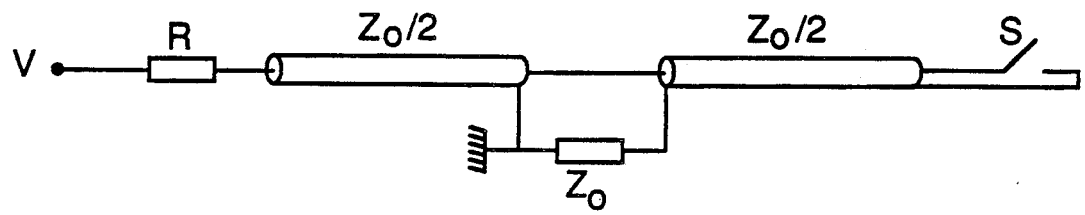
FIG. 7 is the electrical equivalent of FIG. 6.
Figure 7A:
FIG. 7A is a sketch of the pulse produced by the embodiment depicted in FIGS. 6 and 7.

FIG. 6 is a schematic diagram of an embodiment designed to provide a Blumlein pulse generator circuit. The corresponding electrical circuit is shown at FIG. 7 and the pulse is shown in FIG. 7A.

In our preferred embodiment, the charging voltage is 30 kV, the load resistance is 50 $\Omega$, the laser pulse width is 100 ps with a repetition rate of 1 MHz. With the Klystron buncher, the electron pulse length is compressed to about 10 ps. This electron pulse can trigger the diamond switch with the resultant output power about 10 MW, pulse width can range from 100 ps-1 ns. Without the Klystron buncher, the electron bunch will spread, therefore they can only generate electrical pulses in excess of several ns.

The improvement of the present invention over the prior art ultraviolet laser controlled diamond switches is a factor of 1000 to 10,000 in terms of magnitude of the laser power required for switching. Another advantage is that the laser source can be visible light rather than ultraviolet which can be generated with higher efficiency and higher power.

Synthetic diamond film has been manufactured in many R & D laboratories around the word. Availability of these films will be better as the technology develops. One can take full advantage of the special properties of the thin diamond film substrate for application in high power impulse generation. Thickness of the diamond film ranges from a few to a few tens micrometer. In this case, electron energy as the order of a few tens kilovolt is sufficient to generate uniform conduction electron-hole plasma in the diamond film for switching. Yet this thickness can hold off several kilovolt charged energy which is stored in a transmission line. This enables a miniature high power, impulse generator to be made. One can increase the power further by combining these miniature units together in parallel for much higher power output. It is the inventor's vision that these miniature units can be assembled in a single chip just as in an integrated circuit which will become a very useful power source for many applications.

Figure 8:
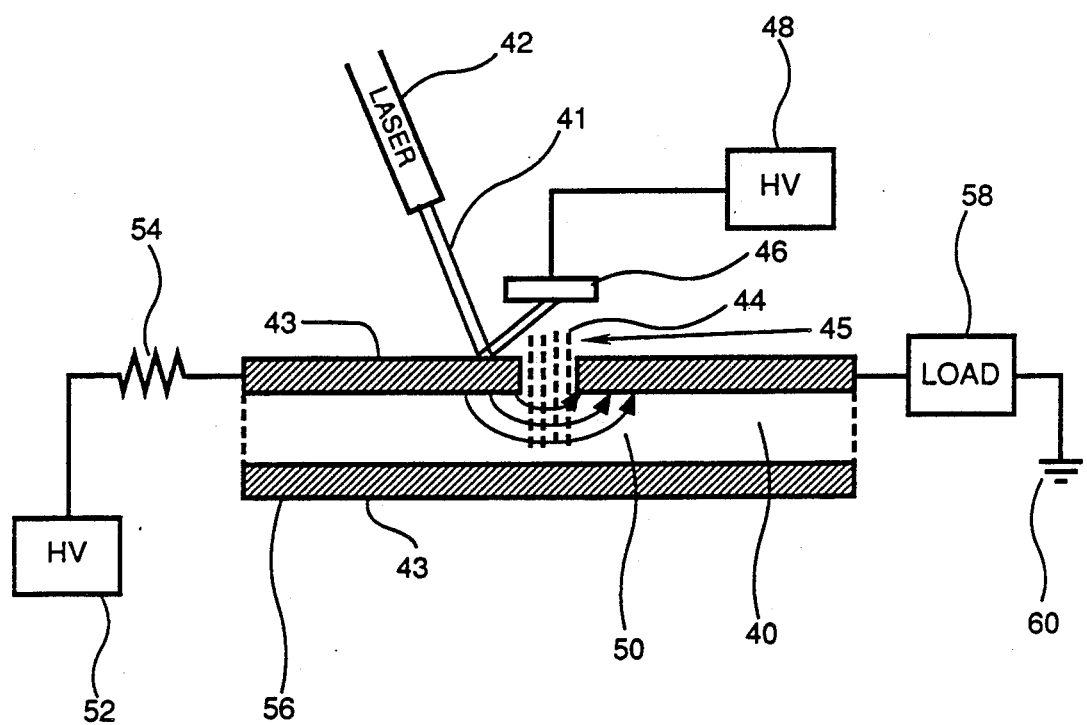
FIG. 8 is a schematic diagram of an embodiment of the present invention utilizing a diamond film.

A preferred embodiment utilizing a diamond film is shown in FIG. 8. The diamond film 40 is sandwiched between two metal conductor sheets 43 forming a stripline transmission line with a gap as shown at 45. A laser beam 41 from laser source 42 stimulates the emission of a pulse of electrons 44 from cathode 46 supplied by high voltage power supply 48. The pulse of electrons permits current to flow from high voltage source 52 through resistance 54 along stripline transmission line 56 through load 58 to ground 60. The current does not flow through the thickness of the diamond film because the electrons penetrate only far enough for the current to flow across the gap at 45.

Preferably high voltage source 48 is in the range of about 20 kV and source 52 is in the range of 1 to 5 kV. The diamond film would preferably be 2–10 microns. Conductor sheets cold be copper or any suitable conductor using known technology such as sputtering of copper onto the diamond film.

With the embodiment I expect to be able to achieve 10–100 kW pulses at a 10–100 MHz repetition rate from one unit. By combining many of these units the output is virtually unlimited.

The unit can be made very small, i.e., about 5 microns thick, about 10 microns long and about 5 microns wide. They will be very useful in a phase array radar source, each switch providing power to a single antenna of the phased array radar.

While the above description contains many specifications, the reader should not construe then as limitations on the scope of the inventor, but merely as exemplifications of preferred embodiments thereof. Those skilled in the art will envision many other possible variations are within its scope. Accordingly the reader is requested to determine the scope of the invention by the appended claims and their legal equivalent, and not by the examples which have given.

I claim:

1. A high power fast switch for generating pulses of current, said pulses being triggered by laser pulses comprising:
    (a) a photoemission cathode having an electron emitting surface and a connection means for connecting said emitting surface to a high voltage biasing source,
    (b) a diamond target positioned so as to be illuminated by electrons emitted from said emitting surface when said emitting surface is illuminated by said laser pulses,
    (c) a first conductor means attached to said diamond target for connection to a high voltage power source, and
    (d) a second conductor means, attached to said diamond target but not in contact with said first conductor, for connecting said diamond target to a load,
    (e) said cathode, said connection means, said target and said first and second conductor means being arranged so that then when said connection means is connected to said high voltage biasing source, said first conductor means is connected to said high voltage power source, second conductor means is connected to said load, and a pulse of said laser pulses illuminates said cathode, said high power fast switch closes permitting a high voltage, high current pulse of electric current to flow from said high voltage power source to said load.

2. A switch as in claim 1 and further comprising a compressing means for compressing pulses of electrons emitted from said cathode onto said diamond target.

3. A switch as in claim 1 wherein said compressing means is a Klystron buncher.

4. A switch as in claim 1 wherein said diamond target is a diamond chip.

5. A switch as in claim 1 wherein said diamond chip is smaller than 0.1 carat.

6. A switch as in claim 1 wherein said diamond target is a diamond film.

7. A switch as in claim 1 wherein said laser means is a frequency doubled Nd:YAG laser.

* * * * *